United States Patent
Chia et al.

(10) Patent No.: US 9,147,558 B2
(45) Date of Patent: Sep. 29, 2015

(54) FINNED SHUTTER DISK FOR A SUBSTRATE PROCESS CHAMBER

(71) Applicant: APPLIED MATERIALS, INC., Santa Clara, CA (US)

(72) Inventors: Bonnie T. Chia, Sunnyvale, CA (US); Song-Moon Suh, Sunnyvale, CA (US); Cheng-Hsiung Matthew Tsai, Cupertino, CA (US); Robert Dinsmore, Sunnyvale, CA (US); Glen T. Mori, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 353 days.

(21) Appl. No.: 13/742,692

(22) Filed: Jan. 16, 2013

(65) Prior Publication Data

US 2014/0196848 A1    Jul. 17, 2014

(51) Int. Cl.
*C23C 14/00* (2006.01)
*H01J 37/32* (2006.01)
*C23C 14/56* (2006.01)
*H01J 37/34* (2006.01)

(52) U.S. Cl.
CPC ......... *H01J 37/32715* (2013.01); *C23C 14/564* (2013.01); *H01J 37/32477* (2013.01); *H01J 37/32853* (2013.01); *H01J 37/3405* (2013.01); *H01J 37/3417* (2013.01); *H01J 37/3423* (2013.01); *H01J 37/3447* (2013.01)

(58) Field of Classification Search
CPC .................................................. H01J 37/3447
See application file for complete search history.

(56) References Cited

U.S. PATENT DOCUMENTS

| | | | |
|---|---|---|---|
| 2002/0166762 A1 | 11/2002 | Hixson et al. | |
| 2004/0182698 A1 | 9/2004 | Feltsman | |
| 2010/0059181 A1 | 3/2010 | Lee et al. | |
| 2010/0071625 A1 | 3/2010 | Brown | |
| 2012/0228122 A1* | 9/2012 | Minami | 204/192.1 |

FOREIGN PATENT DOCUMENTS

KR    10-2004-0059871 A    6/2004

OTHER PUBLICATIONS

International Search Report and Written Opinion mailed Apr. 24, 2014 for PCT Application No. PCT/US2013/075570.
U.S. Appl. No. 13/550,997, filed Jul. 17, 2012, Tsai et al.

* cited by examiner

*Primary Examiner* — Keith Hendricks
*Assistant Examiner* — Timon Wanga
(74) *Attorney, Agent, or Firm* — Moser Taboada; Alan Taboada

(57) ABSTRACT

Shutter disks for use in process chambers are provided herein. In some embodiments, a shutter disk for use in a process chamber may include a body having an outer perimeter, a top surface of the body, wherein the top surface includes a central portion having a substantially horizontal planar surface, and at least one angled structure disposed radially outward of the central portion, each of the at least one angled structure having a top portion and an angled surface disposed at a downward angle in a radially outward direction from the top portion toward the outer perimeter, and a bottom surface of the body.

20 Claims, 3 Drawing Sheets

FINNED SHUTTER DISK FOR A SUBSTRATE PROCESS CHAMBER

FIELD

Embodiments of the present invention generally relate to substrate processing chambers.

BACKGROUND

Conventional semiconductor device formation is commonly performed in one or more process chambers which have the capability to process substrates (e.g., semiconductor wafers) in a controlled processing environment. To maintain process uniformity and ensure optimal performance, various conditioning operations are periodically performed. For example, one such conditioning operation is a pasting process, wherein a covering is applied over materials deposited on process chamber surfaces to prevent the deposited materials from flaking off the process chamber surfaces and contaminating the substrate during subsequent processes.

In the aforementioned pasting process, a shutter disk may be positioned via a transfer robot atop a substrate support disposed in the process chamber to prevent the deposition of any materials upon the substrate support. During the pasting process, target material on the shutter disk may be removed from the shutter disk and pasted onto the process kit to prevent flaking.

However, the inventors have observed that during conventional pasting processes, there is non-uniform deposition on the desired chamber surfaces. The non-uniformity of the pasting layer results in particle issues on the substrate.

Accordingly, embodiments of shutter disks are provided herein than may provide improved pasting uniformity.

SUMMARY

Shutter disks for use in process chambers are provided herein. In some embodiments, a shutter disk for use in a process chamber may include a body having an outer perimeter, a top surface of the body, wherein the top surface includes a central portion having a substantially horizontal planar surface, and at least one angled structure disposed radially outward of the central portion, each of the at least one angled structure having a top portion and an angled surface disposed at a downward angle in a radially outward direction from the top portion toward the outer perimeter, and a bottom surface of the body.

In some embodiments, a process chamber may include a chamber body defining an inner volume, a process kite disposed in the chamber body, a substrate support disposed within the chamber body for supporting a substrate, a shutter disk fabricated from a target material, and a transfer robot movably coupled to the chamber body for transferring the shutter disk to and from the substrate support. In some embodiments, the shutter disk may include a top surface of the body, wherein the top surface includes at least one substantially horizontal planar surface, and at least one angled structure, each of the at least one angled structure having a top portion and an angled surface disposed at a downward angle in a radially outward direction from the top portion toward the outer perimeter.

Other embodiments and variations of the present invention are disclosed in greater detail below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
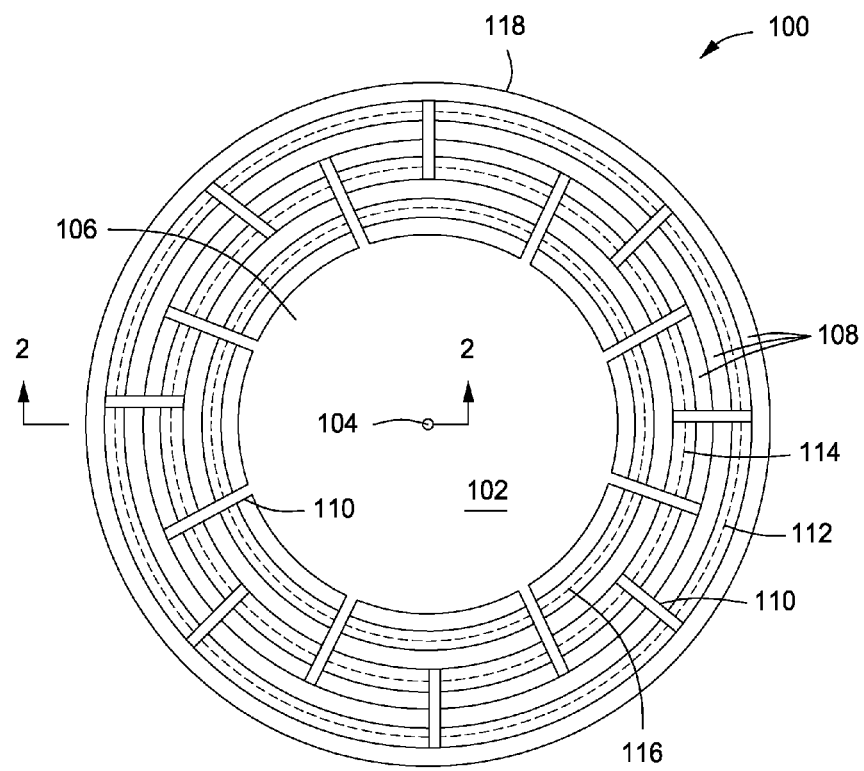
FIG. 1 a is a top view of an exemplary shutter disk in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to a shutter disk for use in substrate process chambers, such as, for example, semiconductor manufacturing process chambers, and to substrate process chambers incorporating such shutter disks. In some embodiments, the inventive apparatus includes a shutter disk for use in conditioning and cleaning operations of process chambers. The inventive apparatus may advantageously provide a shutter disk that provides better pasting uniformity of shutter disk target material onto the walls of a process kit or process chamber.

Figure 2:
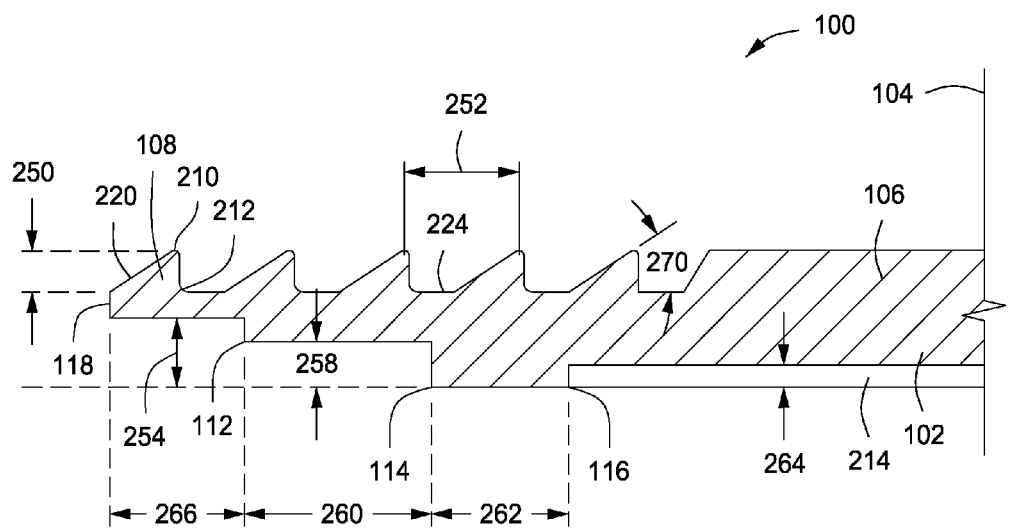
FIG. 2 depicts a partial cross sectional view of an exemplary shutter disk, in accordance with some embodiments of the present invention.

FIG. 1 is a top view of the exemplary shutter disk 100, in accordance with some embodiments of the present invention. FIG. 2 depicts a cross sectional side view of the exemplary shutter disk of FIG. 1, in accordance with some embodiments of the present invention. To best understand the invention, the reader should refer simultaneously to FIGS. 1 and 2. In addition, in this document, relational terms such as first and second, top and bottom, and the like may be used solely to distinguish one entity or action from another entity or action without necessarily requiring or implying any actual such relationship or order between such entities or actions. Furthermore, although described herein as a disk, the shutter disk and its components may have any suitable geometry as required for use within a particular process chamber Exemplary shutter disk 100 generally comprises a body 102 having an outer diameter 118 and a central axis 104. In some embodiments, the shutter disk is a solid disk and configured to substantially cover a substrate support when disposed over the substrate support. The shutter disk 102 is fabricated from a target material to be deposited on walls of a process chamber, or a process kit disposed in a process chamber, during a process chamber process such as, for example, a pasting process or other preclean process. The target materials used may include any suitable pasting material, such as ductile materials with a lower Young's Modulus to help to reduce shear stress and brittleness, while having a higher sputtering rate. Examples of such materials include aluminum, an aluminum alloy, titanium, copper, silver, gold, a metal composite, and the like.

A top surface of the body 102 of shutter disk 100 may include a central portion 106 having a substantially horizontal planar surface. In some embodiments, the central portion 106 may be circular as shown in FIG. 1, however any suitable geometry may be used. The top surface of the body 102 of shutter disk 100 may also include one or more angled structures 108, or "fins", disposed radially outward of the central portion 106. The height of the central portion 106 from the top surface of the body 102 may be about 0.03 inches to about 0.3 inches.

As shown in FIG. 2, each of the one or more angled structures has a top portion 210 and an angled surface 220 disposed at a downward angle in a radially outward direction from the top portion 210 toward the outer perimeter 118. The top portion 210 of angled structure 108 may be rounded to providing arcing during pasting and other plasma processes performed. The downward angle 270 of the angled surface 220 is about 15 degrees to about 60 degrees. Each of the one or more angled structures includes a backside (not shown) that opposes the angled surface 220. In some embodiments, the one or more angled structures 108 include a plurality of angled structures 108 (e.g., fins) sufficient to uniformly deposit target pasting material onto side walls and corners of a process chamber and/or process kit (as will be described in more detail below with respect to FIG. 4). In some embodiments, each of the plurality of angled structures 108 is radially separated by a substantially horizontal planar surface 224. The distance 252 between the top portion 210 of two adjacent fins may be about 0.1 inches to about 1.0 inches. The corner 212 between each angled structure 108 and the substantially horizontal planar surface 224 is rounded to prevent arcing that may occur at sharp corners. The height 250 of each angled structure 108 from a top surface of the shutter disk 100 may be about 0.06 inches to about 0.3 inches.

In some embodiments, the one or more angled structures 108 may be annular structures disposed at different radial distances from the center 104 of the shutter disk 100. In some embodiments, a plurality of radial support ridges 110 are disposed on the top surface of the body 102 to provide structural strength to substantially prevent the shutter disk 100 from bowing/warping during high power and/or high temperature processing. The plurality of support ridges 110 may extend radially outward from the center 104 of the shutter disk 100 and may be equidistantly spaced from each other. In some embodiments, at least some of the plurality of ridges 110 may be extend directly and radially outward from the central portion 106 of the shutter disk 100, and/or at least some of the plurality of ridges 110 may extend directly and radially inward from the top surface 210 of the outermost angled structures 108 on the shutter disk 100.

In some embodiments, the bottom of shutter disk 100 may include a double step connecting the bottom surface to the outer diameter 118 of the shutter disk 100. The double step may include an outer step 112 and an inner step 114, the outer step extending upward further into the body than the inner step. The outer step 112 may help avoid stacking tolerance, material accumulation at the edge, and possible bonding the of shutter disk to an adjacent supporting structure. For example, when multiple components are assembled together, or sitting on top of each other such as shutter disk 100 sitting on a substrate support, the dimensional tolerance of each component will be the addition of the maximum of each design. In a situation where flatness is critical, designing the components to avoid or minimize the stacking tolerance is important. As such, the outer step 112 may help avoid stacking tolerance. In some embodiments, the inner step 114 may be used to facilitate centering of the shutter disk on a supporting structure such as a shutter disk carrier. In some embodiments, the outer step 112 may have a depth 254 extending upward into the body 102 by about 0.05 inches to about 0.1 inches from the bottom surface of the body 102. The outer step 112 may be disposed about 0.1 inches to about 0.5 inches from the outer diameter 118 (shown as length 266). In some embodiments, the inner step 114 may have a depth 258 extending upward into the body 102 by about 0.05 inches to about 0.1 inches from the bottom surface of the body 102. The inner step 114 may be disposed about 0.5 inches to about 1.0 inches from the outer step 112 (shown as length 260).

In some embodiments, the body 102 of shutter disk 100 may also include a cutout portion 214 formed in the bottom surface at step feature 116 and disposed radially inward of the double step. The cutout portion 214 may be used to reduce material usage and weight. In some embodiments, the cutout portion 214 may have a depth 264 extending upward into the body 102 up to about 0.1 inches from the bottom surface of the body 102. The step feature 116 may be disposed about 0.1 inches to about 4.5 inches from the beginning of the double step (i.e., inner step 114) (shown as length 262).

Figure 3:
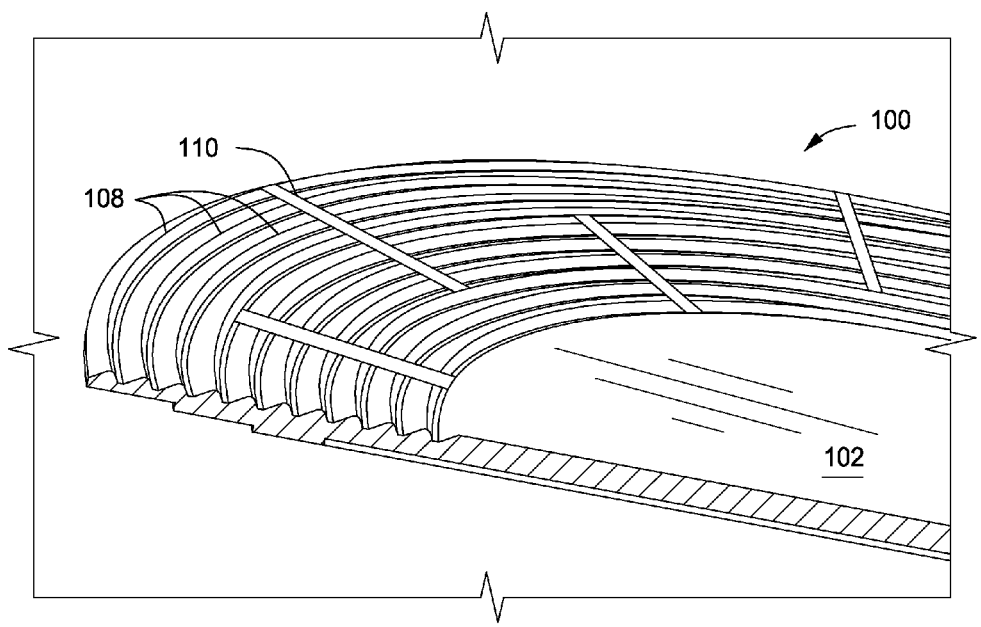
FIG. 3 depicts an isometric view of an exemplary shutter disk, in accordance with some embodiments of the present invention.

FIG. 3 depicts an isometric view of shutter disk 100 showing the body 102, angled structures 108, center portion 106 and the support ridges 110.

The shutter disk 100 may be fabricated from a target material to be deposited on walls of a process chamber, or a process kit disposed in a process chamber, during a process chamber preclean process, for example. Typically, the shutter disk 100 and all its features comprised of the same target material to prevent any relative deformation between the features. In some embodiments, the shutter disk may be fabricated from a target material selected from a group consisting of aluminum, an aluminum alloy, titanium, and a metal composite. The shutter disk 100 may be constructed of any suitable material having a mechanical stiffness sufficient enough to resist deformation due to the additional weight of materials which may be deposited atop the shutter disk 100. In some embodiments, the material may also be lightweight so as to allow the shutter disk 100 to be easily maneuvered by a transfer robot. The shutter disk 100 may be fabricated via any method suitable for forming the desired shape, for example, mold casting, die casting, spray casting, spray deposition, machining or the like. In some embodiments, the shutter disk 100 and all its features are machined from one block of material. In some embodiments, the shutter disk 100 is comprised of the same material used in the process chamber for depositing/etching substrates.

Figure 4:
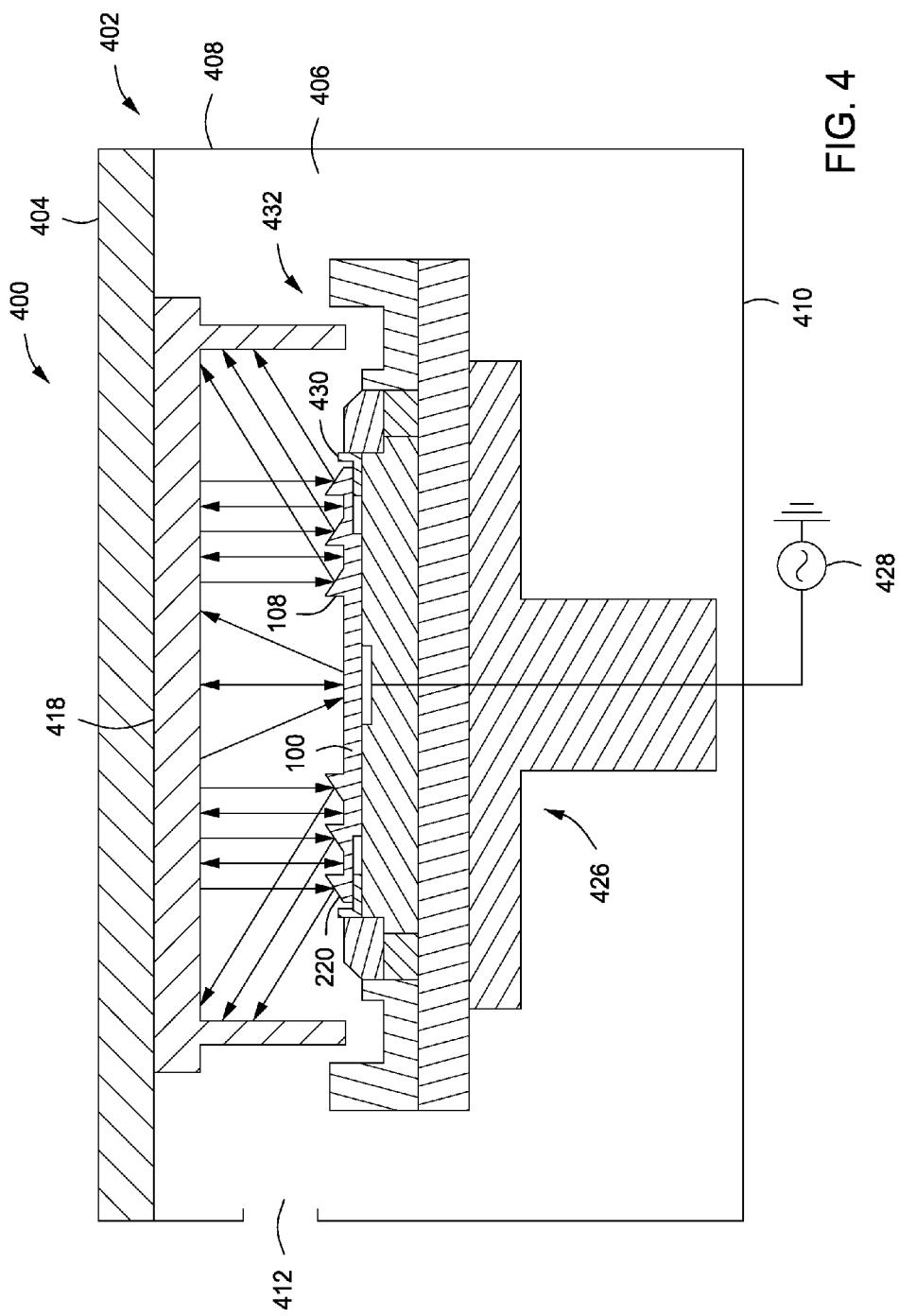
FIG. 4 is a schematic diagram of an exemplary process chamber suitable for use in connection with some embodiments of the present invention.

FIG. 4 is a schematic diagram of an exemplary process chamber 400 for use in connection with some embodiments of the present invention. In some embodiments, the process chamber 400 may be one of a plurality of chambers combined to form a multi-chamber processing system (e.g., a cluster tool or inline tool). Alternatively, the process chamber 400 may be a standalone process chamber. In some embodiments, the process chamber 400 may be a deposition chamber, for example, a physical vapor deposition (PVD) chamber. Alternatively, the process chamber 400 may be any suitable process chamber in which a shutter disk 100 may be used during chamber cleaning and or seasoning processes.

The process chamber 400 includes a chamber body 402 and a lid assembly 404 that defines an evacuable process volume 406. The chamber body 402 generally includes one or more sidewalls 408 and a bottom 410. The one or more sidewalls 408 may be a single circular sidewall or multiple sidewalls in process chambers having non-circular configurations. In other embodiments, a shutter garage (not shown) located outside of process chamber 400 may store the shutter disk 100 and move it into process chamber 400 through an opening 412 in process chamber 400.

The lid assembly 404 of the chamber body 402 generally supports an annular shield 418. The lid assembly 404 generally comprises a target and a magnetron (not shown).

As discussed above, the shutter disk 100 provides material that is deposited the chamber walls during a preclean or similar process to condition the chamber for substrate processing. The angled structures 108 on the shutter disk 100 enhances uniform consumption of the target material that shutter disk 100 is coated with, or fabricated from, during processing. The shield 418 and substrate support 426 are biased relative each other by a power source 428. An inert gas, for example, argon, is supplied to the process volume 406 from a gas source (not shown). A plasma is formed between the shutter disk 100 and the shield 418 from the gas. Ions within the plasma are accelerated toward shutter disk 100 and cause material to become dislodged from the shutter disk 100. The dislodged target material is attracted towards the chamber walls 404, 408, 410, shield walls 418 and process kit 432 and deposits a film of material thereon.

The substrate support 426 is generally disposed in the chamber body 402 and supports shutter disk 100. A lower carrier member 430 may be used to form a two piece shutter disk assembly when shutter disk 100 is disposed on the lower carrier member 430. The shutter disk 100 and the lower carrier member 430 are movably disposed or coupled with respect to each other such that the lower carrier member 430 and the shutter disk 100 may move in relation to each, for example, to allow for independent thermal expansion and contraction of the components. In some embodiments, the shutter disk 100 may merely rest upon the lower carrier member 430.

The lower carrier member 430 supports the shutter disk 100. In embodiments, a bottom surface of the lower carrier member 430 and the bottom surface of the shutter disk 100 define a substantially planar surface which contacts, and is supported by, substrate support 426. In other embodiments, only the lower carrier member 430 is in contact with substrate support 426, which may be used to control/change RF coupling.

In some embodiments, the carrier member 430 may not be a ring, and may support shutter disk 100 along the entire bottom surface. For example, in some embodiments the lower carrier member 430 may be a solid disk (not shown) with no central opening, similar to shutter disk 100.

The lower carrier member 430 may comprise a thermally stable material to minimize thermal deformation of the lower carrier member 430. For example, lower carrier member 430 may comprise at least one of ceramic, silicon carbide coated graphite, solid silicon carbide, solid sintered silicon carbide, or solid sintered silicon carbide fabricated with metal-free sintering agents, such as PUREBETA®, available from Bridgestone, or the like. In some embodiments, the lower carrier member 430 may comprise a material with a coefficient of thermal expansion of about 5.6E-6 m/m K to about 22.2E-6 m/m K. In some embodiments, the lower carrier member 430 may comprise a thermally conductive material. In some embodiments, the lower carrier member 430 may comprise an electrically insulating material. In any of the embodiments described above, the lower carrier member 430 may be constructed of suitable materials having a mechanical stiffness sufficient enough to substantially resist deformation due to the additional weight of the shutter disk 100 and materials which may be deposited atop the shutter disk 100 during use. In some embodiments, the material may also be lightweight so as to allow the shutter disk assembly (i.e., shutter disk 100 and lower carrier member 430) to be easily maneuvered by a transfer robot. In some embodiments, one or more surfaces of the lower carrier member 430 and/or the shutter disk 100 which are in contact with each other may be finished in such a way to facilitate ease of movement due to thermal deformation between the lower carrier member 430 and shutter disk 100.

In some embodiments, shutter disk assembly (i.e., shutter disk 100 and lower carrier member 430) has an outer diameter of about 6 to about 12 inches, for example about 6, 8, or 11.85 inches. In some embodiments, the thickness from the of the top potion 210 of the shutter disk to the bottom surface of the lower support carrier 430 may be about 0.1 to about 0.25 inches, for example, about 0.15 inches. Other sizes may be used depending upon the configuration and size of the substrate support. In some embodiments, the shutter disk assembly will have an outer diameter equal to that of a diameter of a substrate that is to be processed with a tolerance of +/−50 mm. Although discussed in terms of diameters and referred to as a disk, the shutter disk assembly and the shutter disk 100 are not limited to round shapes and may have any shape suitable for use in a process chamber as disclosed herein. Although discussed in terms of diameters and the terms "ring" or "disc" may be used to describe the shutter disk assembly and components thereof, it is contemplated that the shape of the shutter disk assembly and these components need not be circular and may have a perimeter and/or opening of any shape, including but not limited to, rectangles, polygons, ovals, and the like.

While the foregoing is directed to embodiments of the present invention, other and further embodiments of the invention may be devised without departing from the basic scope thereof, and the scope thereof is determined by the claims that follow.

The invention claimed is:

1. A shutter disk for use in a process chamber, comprising:
a body having an outer perimeter;
a top surface of the body, wherein the top surface includes
  a central portion having a substantially horizontal planar surface, and
  at least one angled structure disposed radially outward of the central portion, each of the at least one angled structure having a top portion and an angled surface disposed at a downward angle in a radially outward direction from the top portion toward the outer perimeter; and
a bottom surface of the body.

2. The shutter disk of claim 1, wherein the downward angle of the angled surface is about 15 degrees to about 60 degrees.

3. The shutter disk of claim 1, wherein the at least one angled structure includes a plurality of angled structures.

4. The shutter disk of claim 3, wherein each of the plurality of angled structures is radially separated by a substantially horizontal planar surface.

5. The shutter disk of claim 3, further comprising:
a plurality of radial support ridges, wherein each radial support ridge extends across at least two of the plurality of angled structures.

6. The shutter disk of claim 5, wherein the plurality of radial support ridges includes a first set of radial support ridges extending radially inward from the top portion of the outermost angled structure, and a second set of radial support ridges that extend radially outward from an outer diameter of the central portion of the top surface.

7. The shutter disk of claim 1, further comprising a double step connecting the bottom surface to the outer diameter.

8. The shutter disk of claim 7, wherein the double step further comprises:
an outer step and an inner step, the outer step extending upward further into the body than the inner step.

9. The shutter disk of claim 7, wherein the body includes a cutout portion formed in the bottom surface disposed radially inward of the double step.

10. The shutter disk of claim 1, wherein the angled structures are annular angled structures.

11. The shutter disk of claim 1, wherein the body of the shutter disk is solid and configured to substantially cover a substrate support when disposed over the substrate support.

12. The shutter disk of claim 1, wherein the shutter disk is fabricated from a target material to be deposited on walls of a process chamber, or a process kit disposed in a process chamber, during a process chamber process.

13. The shutter disk of claim 1, wherein the shutter disk is fabricated from a target material selected from a group consisting of aluminum, an aluminum alloy, titanium, and a metal composite.

14. A process chamber, comprising:
a chamber body defining an inner volume;
a process kit disposed in the chamber body;
a substrate support disposed within the chamber body for supporting a substrate; and
a shutter disk fabricated from a target material, the shutter disk comprising:
a body having an outer perimeter; and
a top surface of the body, wherein the top surface includes at least one substantially horizontal planar surface, and at least one angled structure, each of the at least one angled structure having a top portion and an angled surface disposed at a downward angle in a radially outward direction from the top portion toward the outer perimeter.

15. The process chamber of claim 14, wherein the downward angle of each of the angled surfaces is configured to facilitate uniform deposition of the target material of the shutter disk onto side walls of at least one of the process chamber or the process kit.

16. The process chamber of claim 14, wherein the downward angle of each of the angled surfaces is about 15 degrees to about 60 degrees.

17. The process chamber of claim 14, wherein the at least one angled structure includes a plurality of angled structures.

18. The process chamber of claim 14, further comprising:
a lower carrier member having at least a portion of the lower carrier member disposed below a portion of the shutter disk to support the shutter disk and to create a protective overlap region that prevents exposure of the substrate support upon deformation of the shutter disk.

19. The process chamber of claim 18, wherein the lower carrier member is a ring having a central opening, and wherein the lower carrier member supports the shutter disk such that a bottom surface of the shutter disk is disposed over a central opening of the lower carrier member.

20. The process chamber of claim 19, wherein the bottom surface of the shutter disk includes a step feature disposed above a first feature of the lower carrier member, wherein the first feature of the lower carrier member supports the shutter disk using the step feature, and wherein the step feature of the upper disk member and the first feature of the lower carrier member form the protective overlap region.

* * * * *